(12) United States Patent
Yagi et al.

(10) Patent No.: US 10,934,634 B2
(45) Date of Patent: Mar. 2, 2021

(54) POLYCRYSTALLINE SIC SUBSTRATE AND METHOD FOR MANUFACTURING SAME

(71) Applicant: SICOXS CORPORATION, Tokyo (JP)

(72) Inventors: Kuniaki Yagi, Tokyo (JP); Motoki Kobayashi, Tokyo (JP)

(73) Assignee: SICOXS CORPORATION, Tokyo (JP)

( * ) Notice: Subject to any disclaimer, the term of this patent is extended or adjusted under 35 U.S.C. 154(b) by 8 days.

(21) Appl. No.: 16/091,459

(22) PCT Filed: Apr. 5, 2017

(86) PCT No.: PCT/JP2017/014248
§ 371 (c)(1),
(2) Date: Oct. 4, 2018

(87) PCT Pub. No.: WO2017/175799
PCT Pub. Date: Oct. 12, 2017

(65) Prior Publication Data
US 2019/0153616 A1   May 23, 2019

(30) Foreign Application Priority Data
Apr. 5, 2016 (JP) .............................. JP2016-075920

(51) Int. Cl.
| | | |
|---|---|---|
| *C04B 35/573* | (2006.01) | |
| *C30B 29/36* | (2006.01) | |
| *C30B 28/12* | (2006.01) | |
| *C30B 28/14* | (2006.01) | |
| *H01L 29/16* | (2006.01) | |

(52) U.S. Cl.
CPC ............ *C30B 29/36* (2013.01); *C04B 35/573* (2013.01); *C30B 28/12* (2013.01); *C30B 28/14* (2013.01); *H01L 29/1608* (2013.01)

(58) Field of Classification Search
CPC ....... C23C 16/325; C30B 29/36; C30B 28/12; C30B 28/14; H01L 21/02595
See application file for complete search history.

(56) References Cited

U.S. PATENT DOCUMENTS 5,937,316 A * 8/1999 Inaba .................... C04B 35/565
                                                          438/488
5,993,770 A * 11/1999 Kuroyanagi .......... C23C 16/325
                                                          423/345

(Continued)

FOREIGN PATENT DOCUMENTS

EP        2657377      10/2013
JP        8-188408      7/1996

(Continued)

OTHER PUBLICATIONS

Machine translation of JP H08/188408A, obtained from J PlatPat service of the JPO (Year: 2020).*

(Continued)

*Primary Examiner* — Z. Jim Yang
(74) *Attorney, Agent, or Firm* — Meunier Carlin & Curfman LLC

(57) ABSTRACT

A support substrate 2 is a polycrystalline SiC substrate formed of polycrystalline SiC. Assuming that one of the two sides of the polycrystalline SiC substrate is a first side and that the other side is a second side, a substrate grain size change rate of the polycrystalline SiC substrate, which is a value obtained by dividing a difference between the average value of crystal grain sizes of the polycrystalline SiC on the first side and the average value of crystal grain sizes of the polycrystalline SiC on the second side by a thickness of the polycrystalline SiC substrate, is 0.43% or less. A radius of curvature of the polycrystalline SiC substrate is 142 m or more.

6 Claims, 7 Drawing Sheets

(56) References Cited

U.S. PATENT DOCUMENTS

| | | | |
|---|---|---|---|
| 2002/0173125 A1* | 11/2002 | Takeda | C23C 16/4418 438/496 |
| 2010/0291328 A1* | 11/2010 | Forrest | C23C 16/4418 428/34.1 |
| 2013/0068157 A1 | 3/2013 | Sasaki et al. | |
| 2013/0269596 A1 | 10/2013 | Torimi et al. | |
| 2013/0285060 A1* | 10/2013 | Torimi | C30B 29/36 257/51 |
| 2016/0204023 A1 | 7/2016 | Imaoka et al. | |
| 2017/0037538 A1* | 2/2017 | Masumoto | H01L 21/02529 |
| 2018/0005816 A1* | 1/2018 | Kanbara | C23C 16/4585 |
| 2018/0251910 A1* | 9/2018 | Akiyama | C23C 16/325 |
| 2018/0251911 A1* | 9/2018 | Kubota | C23C 16/325 |
| 2019/0019868 A1* | 1/2019 | Wada | H01L 29/66068 |
| 2019/0058031 A1* | 2/2019 | Figuet | H01L 21/7624 |
| 2019/0157087 A1* | 5/2019 | Akiyama | H01L 21/0445 |

FOREIGN PATENT DOCUMENTS

| | | |
|---|---|---|
| JP | H08188468 | 7/1996 |
| JP | 2012-146695 | 8/2012 |
| JP | 2013-67522 | 4/2013 |
| JP | 2015-15401 | 1/2015 |

OTHER PUBLICATIONS

Extended European Search Report issued for Application No. 17779177.9, dated Nov. 11, 2019, 8 pages.

Chichignoud, G., et al. "High temperature processing of poly-SiC substrates from the vapor phase for wafer-bonding." Surface and Coatings Technology 201.7 (2006): 4014-4020.

Notice of Preliminary Rejection dated Dec. 18, 2019 in Korean Patent Application No. 10-2018-7031205 and its full English translation, 13 pages.

English translation of International Preliminary Report on Patentability dated Oct. 18, 2018, from International Application No. PCT/JP2017/014248, 9 pages.

Notice of Reasons for Refusal for Japanese Patent Application No. 2018-510638 dated May 21, 2019 and English Language Translation, 8 pages.

International Search Report dated Jun. 13, 2017, from International Application No. PCT/JP2017/014248, 2 pages.

Office Action and English Language Translation issued for Application No. 201780022271.9, dated May 7, 2020, 11 pages.

\* cited by examiner

POLYCRYSTALLINE SIC SUBSTRATE AND METHOD FOR MANUFACTURING SAME

CROSS-REFERENCE TO RELATED APPLICATION

This international application claims the benefit of Japanese Patent Application No. 2016-75920 filed on Apr. 5, 2016 with the Japan Patent Office, and the entire disclosure of Japanese Patent Application No. 2016-75920 is incorporated herein by reference.

TECHNICAL FIELD

The present disclosure relates to a polycrystalline SiC substrate formed of polycrystalline SiC.

BACKGROUND ART

Silicon carbide (SiC) is a wide bandgap semiconductor having a wide forbidden band width of 2.2 to 3.3 eV. Because of its excellent physical and chemical properties, SiC has been researched and developed as an environment-resistant semiconductor material. Particularly in recent years, SiC has been attracting attention as a material for high-voltage/high-power electronic devices, high-frequency electronic devices, and optical devices for short wavelength light from blue to ultraviolet, and research and development has been actively carried out. However, it is difficult to manufacture good-quality large-diameter single crystal of SiC, whereby practical application of SiC devices has been hindered so far.

In order to solve these problems, an improved Rayleigh method has been developed in which sublimation recrystallization is performed using a SiC single crystal substrate as a seed crystal. Such an improved Rayleigh method makes it possible to grow SiC single crystal while controlling crystal polytype (4H—SiC, 6H—SiC, 15R—SiC, and so on), shape, carrier type, and concentration of the SiC single crystal. By optimizing the improved Rayleigh method, the crystal defect density decreases remarkably, and it has become possible to form electronic devices such as a Schottky diode (SBD) and a field effect transistor (MOS-FET) on the substrate.

However, in the improved Rayleigh method, in which the SiC single crystal substrate is used as the seed crystal, the crystal growth rate of the single crystal SiC is low, and processing cost for processing a SiC single crystal ingot into a wafer shape through steps consisting mainly of cutting and grinding is high, resulting in high manufacturing cost of the single crystal SiC substrate. Such high manufacturing cost is also a factor hindering practical application of SiC devices. Thus, it has been strongly desired to develop a technology enabling provision of SiC substrates for semiconductor devices, particularly for high-voltage/high-power electronic elements, at low cost.

Provided under such circumstances is a technique of manufacturing a semiconductor substrate realizing both low cost (a support substrate portion) and high quality (a SiC portion) by using good-quality single crystal SiC only in a device forming layer portion (see, for example, Patent Document 1). Specifically, such single crystal SiC is fixed to a support substrate (material having strength, heat resistance, and cleanliness that can withstand device manufacturing steps: e.g., polycrystalline SiC) by a bonding method not involving formation of an oxide film at a bonding interface.

Generally, "warpage" of a substrate is a very important element to consider in device preparation steps. This is because, in the case of the substrate with large warpage, a part of the substrate surface deviates from the focal point in the exposure process (lithographic process), resulting in failure to form a clear mask image. Such a phenomenon of defocusing exerts a larger influence as the circuit is finer.

In the high-voltage/high-power electronic element, reduction of the electrical resistance of the element is required in order to reduce power loss. The electrical resistance of the element is proportional to the length across the substrate; thus, reduction of the substrate thickness is eagerly desired for the substrate for the high-voltage/high-power electronic element. However, when the substrate is made thinner, warpage of the substrate becomes larger due to unignorable influence of the residual stress within the substrate, and disadvantage of easy occurrence of breakage is caused.

PRIOR ART DOCUMENTS

Patent Documents

Patent Document 1: Japanese Unexamined Patent Application Publication No. 2015-15401

SUMMARY OF THE INVENTION

Problems to be Solved by the Invention

Polycrystalline SiC substrates are formed by a method in which SiC is grown on a base material formed of, for example, carbon or the like by chemical vapor deposition (CVD) and then the base material is removed, or by a method in which SiC microcrystalline powder is compression-molded using a sintering aid or the like and then the compression-molded article is heated to a temperature not higher than the sublimation temperature of SiC to cause the microcrystals adhere to each other. The former is a dense substrate with a remarkably low impurity concentration and free of voids; whereas the latter contains remaining voids. Therefore, the former is preferred as a polycrystalline SiC substrate used for a bonded substrate for semiconductors. Generally, in chemical vapor deposition, phenomena such as enlargement of crystal grain size and mutual joining of crystal grains occur with the growth in the thickness range (up to 1 mm) of a grown film to be actually used in the substrate. Consequently, internal stress is generated in the polycrystalline SiC substrate, and the polycrystalline SiC substrate is warped.

The present disclosure is to reduce warpage of a polycrystalline SiC substrate.

Means for Solving the Problems

One aspect of the present disclosure is a polycrystalline SiC substrate formed of polycrystalline SiC, wherein, assuming that one of two sides of the polycrystalline SiC substrate is a first side and that another side is a second side, a substrate grain size change rate, which is a value obtained by dividing a difference between an average value of crystal grain sizes of the polycrystalline SiC on the first side and an average value of crystal grain sizes of the polycrystalline SiC on the second side by a thickness of the polycrystalline SiC substrate, is 0.43% or less, and wherein a radius of curvature of the polycrystalline SiC substrate is 142 m or more.

Insofar as an object of the present disclosure is achieved, the polycrystalline SiC may contain components other than carbon and silicon. For example, for the purpose of lowering the resistivity of the polycrystalline SiC substrate, nitrogen, phosphorus, and so on may be contained as impurities.

The thus-configured polycrystalline SiC substrate of the present disclosure makes it possible to reduce the influence of the residual stress within the polycrystalline SiC substrate owing to the decreased crystal grain size change rate within the substrate, and the warpage of the polycrystalline SiC substrate can thereby be reduced.

In the polycrystalline SiC substrate of the present disclosure, on at least one of the first side or the second side, a degree of surface roughness represented by an arithmetic average roughness may be 1 nm or less. Also, in the polycrystalline SiC substrate of the present disclosure, on a surface of at least one of the first side or the second side, all recesses formed on the surface each may be such that a distance between the surface and a point in the recess farthest from the surface is 3 nm or less.

The thus-configured polycrystalline SiC substrate of the present disclosure, owing to the surface of the polycrystalline SiC substrate being less uneven, makes it possible, in manufacturing a bonded substrate in which a semiconductor layer formed of single crystal SiC is bonded onto the polycrystalline SiC substrate, to increase the bonding strength in a bonded interface between the semiconductor layer formed of the single crystal SiC and the polycrystalline SiC substrate. Consequently, fabrication yields of the bonded substrate can be improved.

In the polycrystalline SiC substrate of the present disclosure, the polycrystalline SiC may be grown by chemical vapor deposition, or the polycrystalline SiC may be grown by a sublimation method.

A method for manufacturing a polycrystalline SiC substrate according to another aspect of the present disclosure comprises a base material preparation step, a growth step, and a separation step, and a base material grain size change rate, which is a value obtained by dividing a difference between an average value of crystal grain sizes of polycrystalline SiC on one of two sides of a second base material and an average value of crystal grain sizes of polycrystalline SiC on another side by a thickness of the second base material, is 0.43% or less.

In the base material preparation step, the polycrystalline SiC is grown on a first base material under a first growth condition set in advance, and then the polycrystalline SiC grown on the first base material is cut out, to thereby prepare the second base material formed of the polycrystalline SiC. In the growth step, polycrystalline SiC is grown on the second base material under a second growth condition set in advance. In the separation step, at least a part of the polycrystalline SiC grown on the second base material is separated from the second base material to use a separated polycrystalline SiC as the polycrystalline SiC substrate.

The first growth condition and the second growth condition each refer to a condition for growing SiC on the base material. The first growth condition and the second growth condition may include, for example, a growing method for growing SiC, and a growth temperature and source gas for growing SiC by this growing method.

The thus-configured method for manufacturing a polycrystalline SiC substrate of the present disclosure is a method for manufacturing the polycrystalline SiC substrate of the present disclosure; thus, effects similar to those of the polycrystalline SiC substrate of the present disclosure can be obtained.

EXPLANATION OF REFERENCE NUMERALS

1 . . . bonded substrate, 2 . . . support substrate, 3 . . . semiconductor layer, 11 . . . base material, 12, 22 . . . polycrystalline SiC, 21 . . . carbon base material

MODE FOR CARRYING OUT THE INVENTION

An embodiment of the present disclosure will be described below with reference to the drawings.

Figure 1:
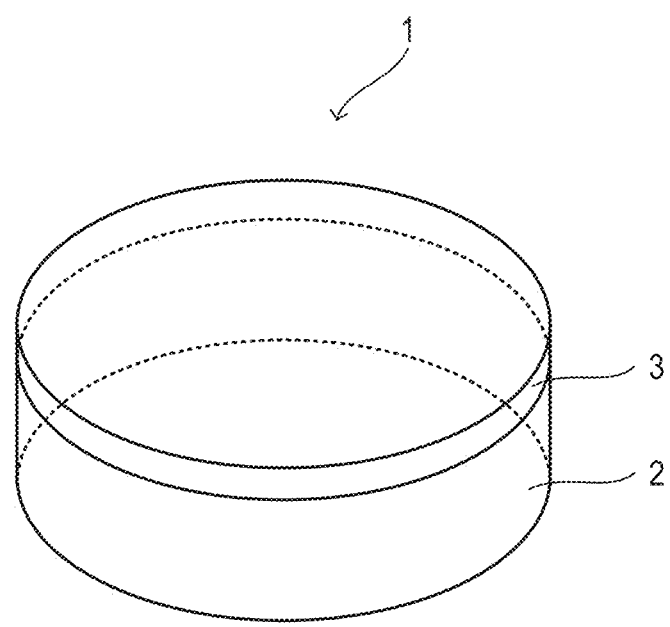
FIG. 1 is a perspective view of a bonded substrate 1.

As shown in FIG. 1, a bonded substrate 1 of the present embodiment comprises a support substrate 2 and a semiconductor layer 3 bonded to a surface of the support substrate 2. The support substrate 2 is formed, of polycrystalline SiC, in a disc-like shape with a thickness of, for example, approximately 350 μm. The polycrystalline SiC of the support substrate 2 comprises any of a 4H—SiC crystal, a 6H—SiC crystal, and a 3C—SiC crystal, or a mixture thereof.

The semiconductor layer 3 is formed, of single crystal SiC, in a disc-like shape with a thickness of, for example, approximately 1 μm. The single crystal SiC of the semiconductor layer 3 comprises any of a 4H—SiC crystal, a 6H—SiC crystal, and a 3C—SiC crystal, or a mixture thereof.

Next, a method for manufacturing the bonded substrate 1 will be described.

Figure 2A:
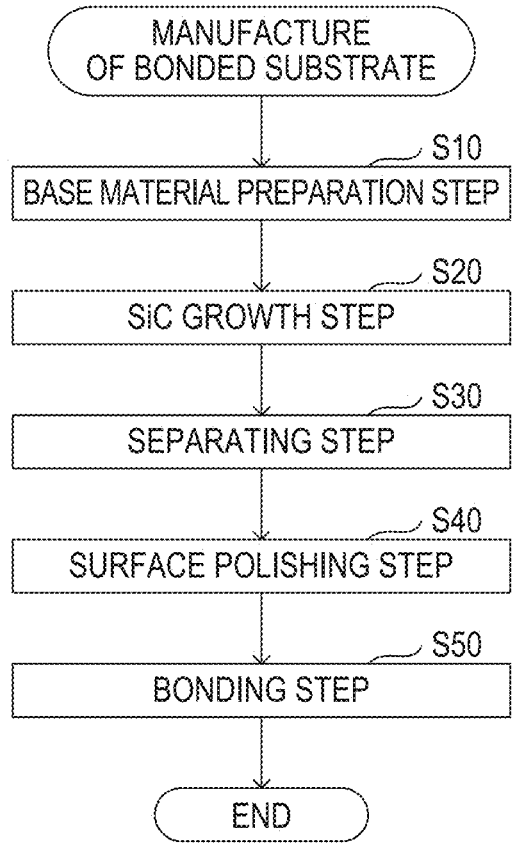
FIG. 2A is a flowchart showing a method for manufacturing the bonded substrate 1.
Figure 2B:
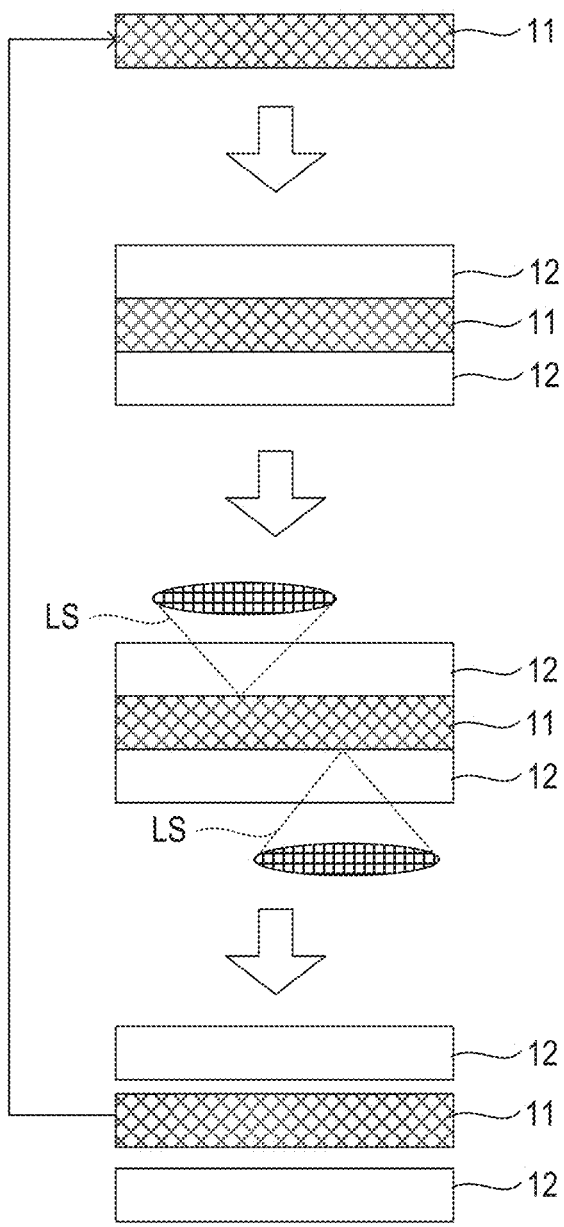
FIG. 2B is a sectional view showing a method for manufacturing a support substrate 2.
Figure 3A:
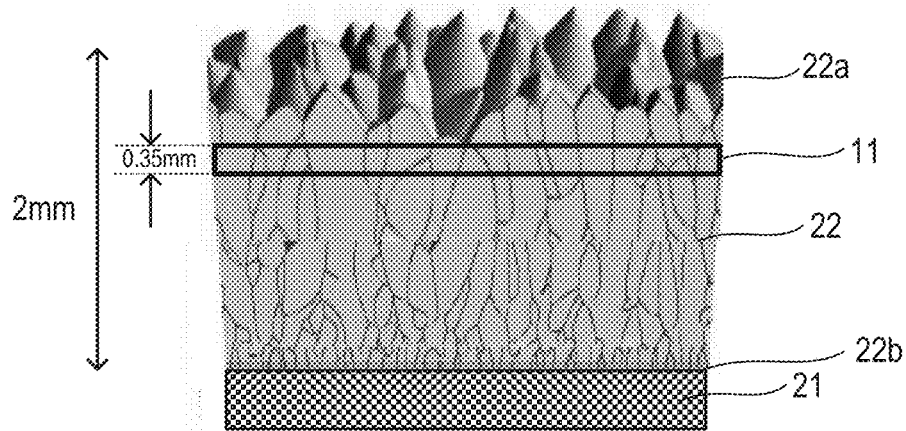
FIG. 3A is a sectional view showing a polycrystalline SiC 22 grown on a carbon base material 21, which is a base material.

As shown in FIG. 2A, in the method for manufacturing the bonded substrate 1, a base material preparation step is first performed in S10. A base material of the present embodiment refers to a material to become a base for growth of the polycrystalline SiC. In the base material preparation step, as shown in FIG. 3A, a polycrystalline SiC 22 with a thickness of, for example, 2 mm is first grown, using chemical vapor deposition (CVD), on a surface of a carbon base material 21 formed of carbon in a disc-like shape. Examples of source gas of Si may include tetrachlorosilane, trichlorosilane, and dichlorosilane. Examples of source gas of C may include ethane, propane, and acetylene. Alternatively, a single gas, such as tetramethylsilane, may be used as source gas. A growth temperature in this chemical vapor deposition is, for example, 1400° C. After the growth of the polycrystalline SiC 22, an outer periphery of a disc-like material having the polycrystalline SiC 22 formed on the surface of the carbon base material 21 is ground. Subsequently, this disc-like material is heated in an air atmosphere at 1000° C. As a result, the carbon base material 21 burns in the air atmosphere, and the carbon base material 21 is removed from the polycrystalline SiC 22. Next, an uppermost growing surface 22a of the polycrystalline SiC 22 is ground by, for example, 0.2 mm to flat it, and then, a carbon base material-side surface 22b of the polycrystalline SiC 22 is ground by, for example, 1.45 mm. In this way, a base material 11 with a thickness of 0.35 mm is obtained (see the base material 11 in FIG. 2B).

Figure 3B:
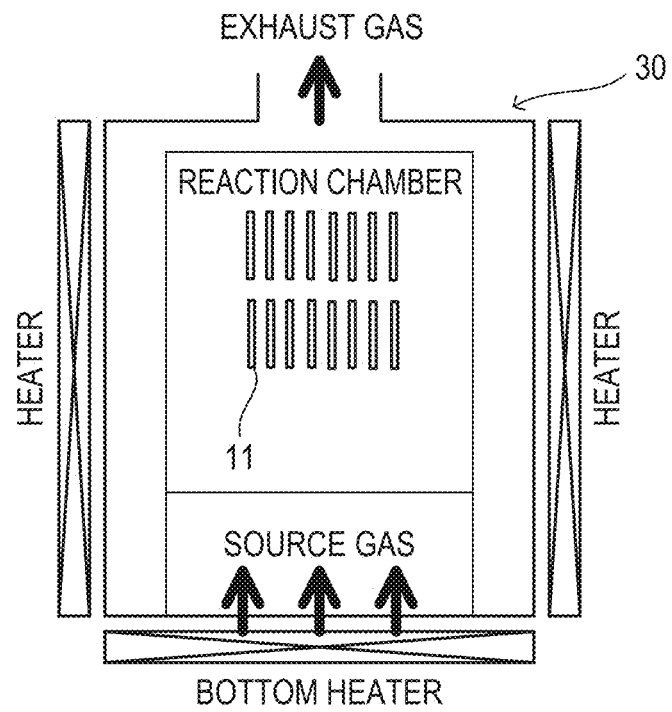
FIG. 3B is a diagram showing a schematic configuration of a batch-type growth furnace 30.

Next, in the method for manufacturing the bonded substrate 1, as shown in FIG. 2A, a SiC growth step is performed in S20. In the SiC growth step, as shown in FIG. 3B, the base material 11 is first loaded into a growth furnace 30. After such loading of the base material 11, a polycrystalline SiC 12 with a thickness of, for example, 400 μm is grown by chemical vapor deposition. Since this is a chemical vapor deposition using a growth furnace, as shown in FIG. 2B, the polycrystalline SiC 12 grows on a front side and a back side of the base material 11. Examples of source gas of Si may include tetrachlorosilane, trichlorosilane, and dichlorosilane. Examples of source gas of C may include ethane, propane, and acetylene. Alternatively, a single gas, such as tetramethylsilane, may be used as source gas. A growth temperature in this chemical vapor deposition is, for example, 1400° C.

Figure 4:
FIG. 4 is a picture showing a polycrystalline SiC 12 growing from a surface of a base material 11.

The base material 11 is formed of polycrystalline SiC. Thus, as shown in FIG. 4, the polycrystalline SiC 12 growing from the surface of the base material 11 inherits the crystal structure of the base material 11. However, in the base material 11, crystal grains are already large and enlargement of grain size has almost reached its limit; thus, grain size change at the time of growing on the base material 11 is small. This makes it possible to achieve a polycrystalline SiC grown homogeneously in a depth direction of the substrate, and a stress generated inside the substrate can thereby be reduced. As a result, it is possible to reduce warpage of the support substrate 2 formed of the polycrystalline SiC 12.

Next, in the method for manufacturing the bonded substrate 1, as shown in FIG. 2A, a separating step is performed in S30. In the separating step, as shown in FIG. 2B, a position at a depth of, for example, 400 μm from a surface of the polycrystalline SiC 12 is irradiated with laser light LS (wavelength: 532 nm), to thereby sublimate SiC.

Then, a two-dimensional scanning is performed with the laser light LS along a plane parallel to a contact interface where the polycrystalline SiC 12 contacts the base material 11. This results in formation of a cutting plane at a position of 400 μm from the surface, and the polycrystalline SiC 12 is separated from the base material 11.

Next, in the method for manufacturing the bonded substrate 1, as shown in FIG. 2A, a surface polishing step is performed in S40. In the surface polishing step, an amorphous layer formed on the surface of the polycrystalline SiC 12 is removed and the surface of the polycrystalline SiC 12 is smoothed first by high-precision grinding and then by CMP polishing. The polycrystalline SiC 12 obtained after the surface polishing step is used as the support substrate 2. It is to be noted that, in S30, an amorphous layer formed on the surface of the base material 11 is removed by hydrogen gas supplied in the process of raising the temperature in the growth furnace 30. That is, a second base material 11 can be reused for manufacturing the support substrate 2.

Next, in the method for manufacturing the bonded substrate 1, a bonding step is performed in S50. In the bonding step, first, hydrogen ions having implantation energy set in advance according to a thickness of the semiconductor layer 3 are implanted from a front side of a single crystal SiC substrate prepared in advance, toward a surface of the single crystal SiC substrate. As a result, in the single crystal SiC substrate, an ion-implanted layer is formed at a specified depth from the surface of the single crystal SiC substrate according to the implantation energy. Subsequently, the surface of the single crystal SiC substrate is bonded to the surface of the polycrystalline SiC 12 manufactured in S40 by a surface activation technique. Then, the polycrystalline SiC 12 and the single crystal SiC substrate bonded together are heated. This causes a fracture of the single crystal SiC substrate at the above-described ion-implanted layer, and the semiconductor layer 3 is delaminated from the single crystal SiC substrate in a state where the semiconductor layer 3 is bonded to the surface of the support substrate 2, whereby the bonded substrate 1 is obtained.

Figure 5:
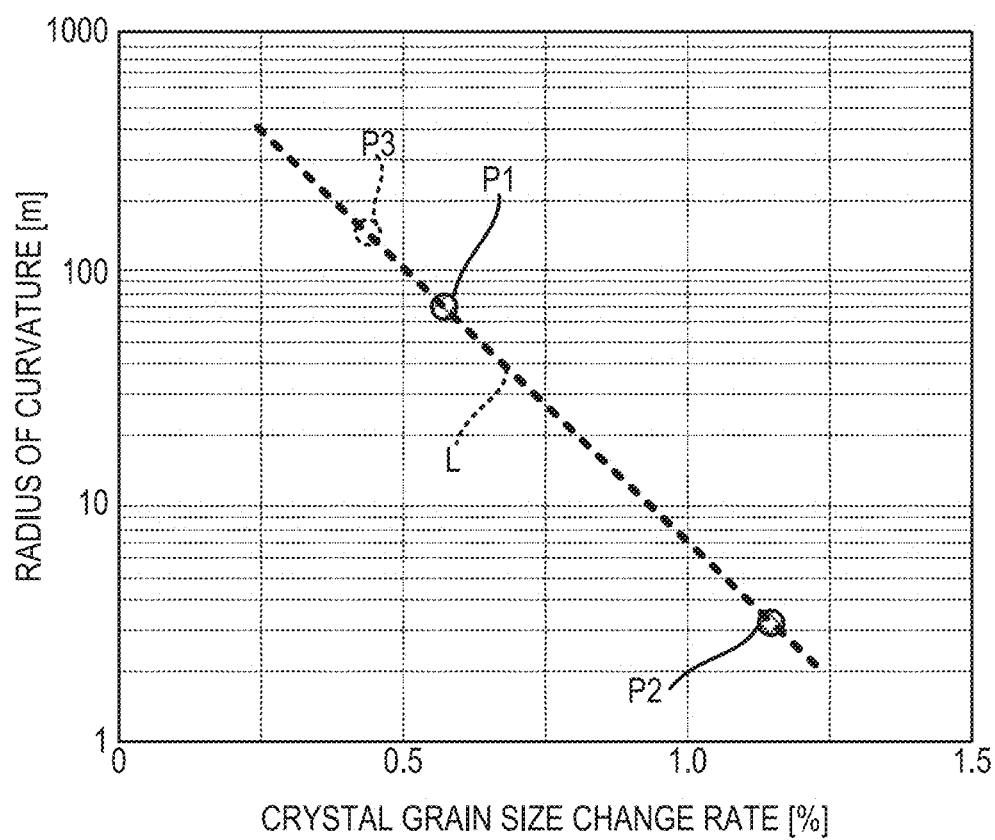
FIG. 5 is a graph showing a correlation between a radius of curvature and a crystal grain size change rate of a support substrate.

FIG. 5 is a graph showing a correlation between a radius of curvature of the support substrate and a crystal grain size change rate of the support substrate.

A radius of curvature of a substrate is a radius of a circle, which best approximates the degree of curvature caused by warping of the substrate.

A crystal grain size change rate of a substrate is a value obtained by dividing a difference between the average value of crystal grain sizes on the front side of the substrate and the average value of crystal grain sizes on the back side of the substrate by a thickness of the substrate. The crystal grain size was calculated as an area equivalent circle diameter, which is a diameter converted based on a circle having the same area as each crystal grain.

Distribution of crystal grains on the front side and the back side of the support substrate is obtained by measuring a crystalline orientation and so on on the front side and the back side of the support substrate using a well-known electron backscatter diffraction (EBSD) analysis.

As shown by a point P1 in FIG. 5, the radius of curvature of the support substrate 2 when the crystal grain size change rate is 0.57% is 69 m. Further, as shown by a point P2 in FIG. 5, the radius of curvature of the support substrate 2 when the crystal grain size change rate is 1.14% is 3 m. As shown in FIG. 5, by extrapolating a straight line L connecting the point P1 and the point P2, it is derived that the crystal grain size change rate of 0.43% or less enables the radius of curvature to be 142 m or more.

Figure 6A:
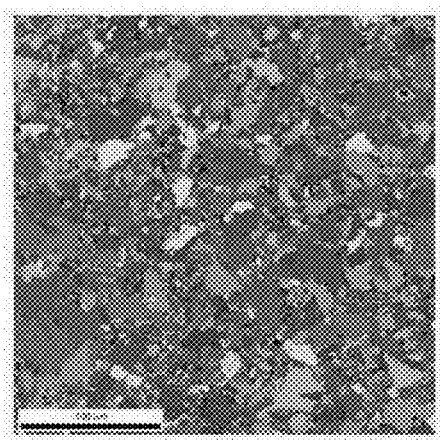
FIG. 6A is a picture showing distribution of crystal grains on a front side of a support substrate having a crystal grain size change rate of 0.57%.
Figure 6B:
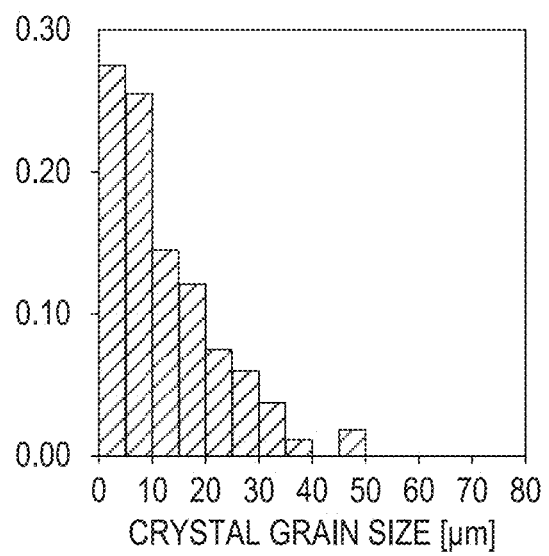
FIG. 6B is a histogram showing distribution of crystal grain sizes on the front side of the support substrate having the crystal grain size change rate of 0.57%.

FIG. 6A is a picture showing distribution of crystal grains on a front side of a support substrate having a crystal grain size change rate of 0.57%. FIG. 6B is a histogram showing distribution of crystal grain sizes on the front side of the support substrate having the crystal grain size change rate of 0.57%. The average value of the crystal grain sizes on the front side of the support substrate is 12 μm.

Figure 6C:
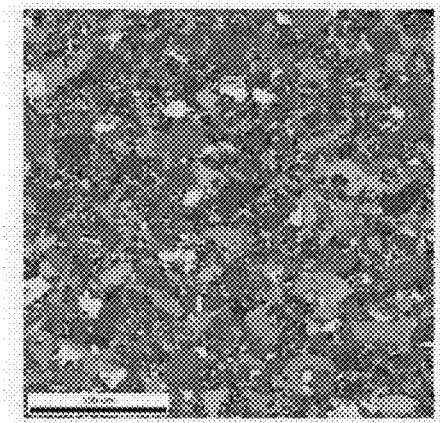
FIG. 6C is a picture showing distribution of crystal grains on a back side of the support substrate having the crystal grain size change rate of 0.57%.
Figure 6D:
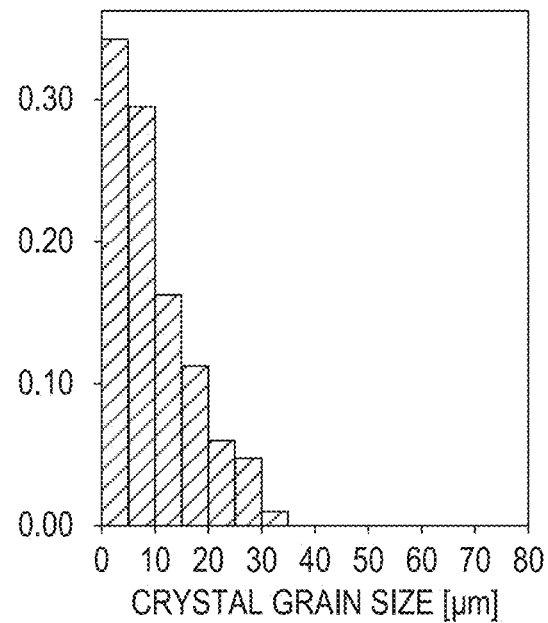
FIG. 6D is a histogram showing distribution of crystal grain sizes on the back side of the support substrate having the crystal grain size change rate of 0.57%.

FIG. 6C is a picture showing distribution of crystal grains on a back side of the support substrate having the crystal grain size change rate of 0.57%. FIG. 6D is a histogram showing distribution of crystal grain sizes on the back side of the support substrate having the crystal grain size change rate of 0.57%. The average value of the crystal grain sizes on the back side of the support substrate is 10 μm.

Since the thickness of the support substrate is 350 μm, the crystal grain size change rate is (12−10)/350×100=0.57[%].

Figure 7A:
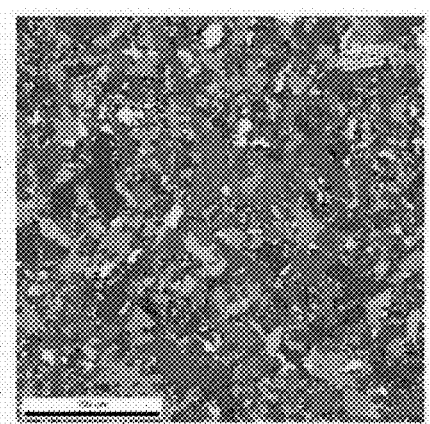
FIG. 7A is a picture showing distribution of crystal grains on a front side of a support substrate having a crystal grain size change rate of 1.14%.
Figure 7B:
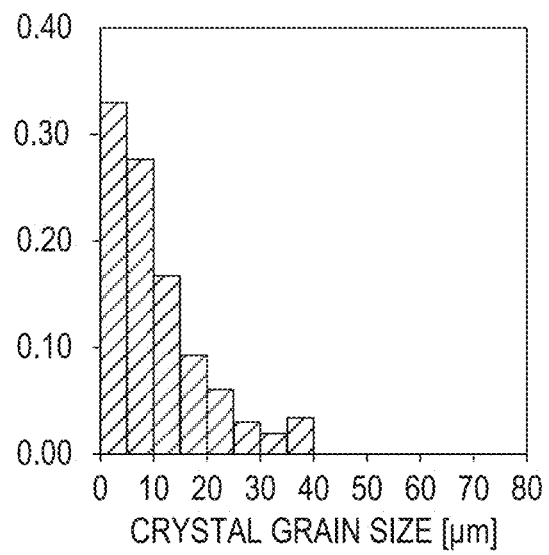
FIG. 7B is a histogram showing distribution of crystal grain sizes on the front side of the support substrate having the crystal grain size change rate of 1.14%.

FIG. 7A is a picture showing distribution of crystal grains on a front side of a support substrate having a crystal grain size change rate of 1.14%. FIG. 7B is a histogram showing distribution of crystal grain sizes on the front side of the support substrate having the crystal grain size change rate of 1.14%. The average value of the crystal grain sizes on the front side of the support substrate is 11 μm.

Figure 7C:
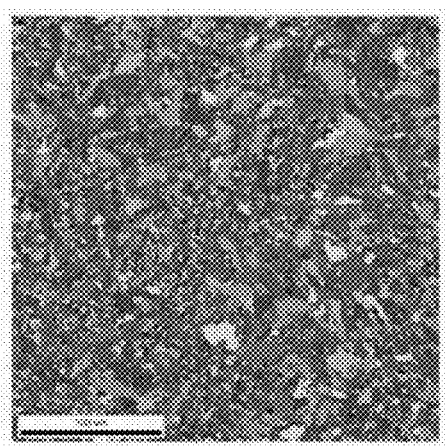
FIG. 7C is a picture showing distribution of crystal grains on a back side of the support substrate having the crystal grain size change rate of 1.14%.
Figure 7D:
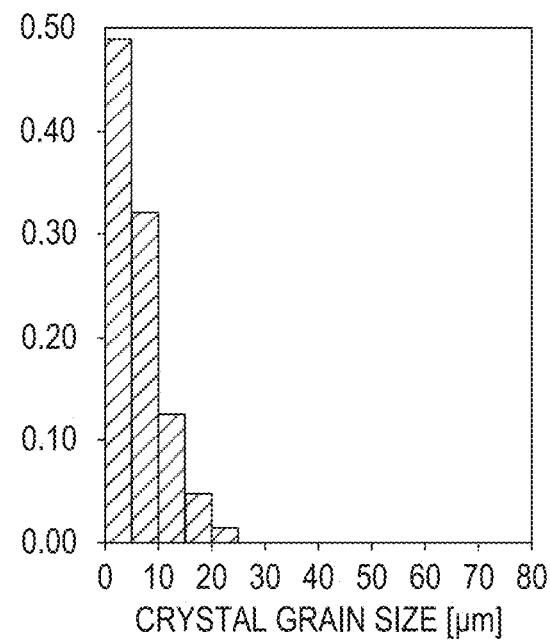
FIG. 7D is a histogram showing distribution of crystal grain sizes on the back side of the support substrate having the crystal grain size change rate of 1.14%.

FIG. 7C is a picture showing distribution of crystal grains on a back side of the support substrate having the crystal grain size change rate of 1.14%. FIG. 7D is a histogram showing distribution of crystal grain sizes on the back side of the support substrate having the crystal grain size change rate of 1.14%. The average value of the crystal grain sizes on the back side of the support substrate is 7 μm.

Since the thickness of the support substrate is 350 μm, the crystal grain size change rate is (11−7)/350×100=1.14[%].

As described above, the polycrystalline SiC 12 growing from the surface of the base material 11 inherits the crystal structure of the base material 11. Thus, in order to manufacture the polycrystalline SiC 12 having the crystal grain size change rate of 0.43% or less, it is necessary, in the SiC growth step of S20, to grow the polycrystalline SiC 12 on the front side and the back side of the base material 11 having the crystal grain size change rate of 0.43% or less.

The thus-configured support substrate 2, which is a polycrystalline SiC substrate formed of polycrystalline SiC, has the crystal grain size change rate of 0.43% or less, and the radius of curvature of the polycrystalline SiC substrate is 142 m or more.

The thus-configured support substrate 2 makes it possible to reduce the influence of the residual stress within the polycrystalline SiC substrate owing to the decreased substrate grain size change rate, and the warpage of the polycrystalline SiC substrate can thereby be reduced.

The method for manufacturing the support substrate 2 comprises the base material preparation step, the SiC growth step, and the separating step, and the crystal grain size change rate of the base material 11 is 0.43% or less.

In the base material preparation step, the polycrystalline SiC 22 is grown on the carbon base material 21 formed of carbon under a first growth condition set in advance (chemical vapor deposition at the growth temperature of 1400° C., in the present embodiment), and then the polycrystalline SiC 22 grown on the carbon base material 21 is cut out, to thereby prepare the base material 11 formed of polycrystalline SiC (S10).

In the SiC growth step, the polycrystalline SiC 12 is grown on the base material 11 under a second growth condition set in advance (chemical vapor deposition at the growth temperature of 1400° C., in the present embodiment) (S20). In the separating step, the polycrystalline SiC 12 grown on the base material 11 is separated from the second base material by irradiation with the laser light LS, and the separated polycrystalline SiC 12 is used as the support substrate 2 (S30).

As described above, in the method for manufacturing the support substrate 2, the polycrystalline SiC is grown on the base material 11 formed of the polycrystalline SiC. That is, the material of the base material 11 is the same as SiC to be grown thereon. Thus, in the SiC growth step, it is possible to achieve the growth of SiC that has inherited the crystal grain size and the crystalline orientation of the surface of the base material 11. Moreover, in the SiC growth step, use of the base material 11 having the crystal grain size change rate of 0.43% or less makes it possible to grow the polycrystalline SiC having the crystal grain size change rate of 0.43% or less on the base material 11. This enables reduction of warpage of the polycrystalline SiC substrate. Furthermore, this makes it unnecessary to cut out a portion whose crystal grain size is uniform in the SiC in order to manufacture the polycrystalline SiC substrate. In other words, in the method for manufacturing the support substrate 2, it is unnecessary to grow SiC not to be used as the polycrystalline SiC substrate on the base material. In this way, the method for manufacturing the support substrate 2 need not include the step of growing, on the base material, redundant SiC not to be used as the polycrystalline SiC substrate or the step of cutting out the portion whose crystal grain size is uniform in the SiC. This can significantly simplify the manufacturing steps.

In the embodiment described so far, the support substrate 2 corresponds to a polycrystalline SiC substrate of the present disclosure, the front side of the support substrate 2 corresponds to a first side of the present disclosure, the back side of the support substrate 2 corresponds to a second side of the present disclosure, and the crystal grain size change rate of the support substrate 2 corresponds to a substrate grain size change rate of the present disclosure.

The step of S10 corresponds to a base material preparation step of the present disclosure, the step of S20 corresponds to a SiC growth step of the present disclosure, and the step of S30 corresponds to a separation step of the present disclosure.

The carbon base material 21 corresponds to a first base material of the present disclosure, the base material 11 corresponds to a second base material of the present disclosure, and the crystal grain size change rate of the base material 11 corresponds to a base material grain size change rate of the present disclosure.

Although one embodiment of the present disclosure has been described so far, the present disclosure is not limited to the above-described embodiment, and can take various forms within the technical scope of the present disclosure.

For example, illustrated in the above-described embodiment is the form in which the polycrystalline SiC 12 is separated from the base material 11 by irradiation with the laser light. However, the polycrystalline SiC 12 may be separated by a wire electric discharge machining technique or a wire saw cutting technique, which are well known.

Illustrated in the above-described embodiment is the form in which the polycrystalline SiC 22 is grown by chemical vapor deposition in the base material preparation step. In the base material preparation step, the base material 11 may be colored by introducing impurities into the polycrystalline SiC 22. This makes it possible to irradiate an interface between the base material 11 and the polycrystalline SiC 12 with the laser light with high accuracy. Consequently, the surface of the base material 11 after the polycrystalline SiC 12 is separated from the base material 11 in the separating step is flatter. Thus, the base material 11 can be reused without performing a process of grinding the surface of the base material 11, whereby the process for reuse of the base material 11 can be simplified.

The resistivity of the polycrystalline SiC 12 has to be lowered in order to use it for a bonded SiC substrate for use in a high-voltage/high-power electronic element. In such a case, impurities such as, for example, nitrogen and phosphorus are introduced into the polycrystalline SiC 12, and the polycrystalline SiC 12 is colored by such introduction of the impurities. Even when the surface of the polycrystalline SiC 12 is irradiated with the laser light LS, the laser light does not reach the interface between the base material 11 and the polycrystalline SiC 12; thus, separating at the interface between the base material 11 and the polycrystalline SiC 12 is difficult. Therefore, in the present disclosure, a form may be employed in which the polycrystalline SiC 12 on a back side is first separated from the base material 11 using another technique and then the back side of the base material 11 is irradiated with the laser light LS to thereby separate the polycrystalline SiC 12 from the base material 11.

In the above-described embodiment, a form may be employed in which the polycrystalline SiC 12 is grown only on the front side of the base material 11 by forming a protective material on the back side of the base material 11 in advance or by arranging the base material 11 in the growth furnace 30 with the back side of the base material 11 unexposed, and then the back side of the base material 11 is irradiated with the laser light LS to thereby separate the polycrystalline SiC 12 from the base material 11.

Illustrated in the above-described embodiment is the form in which the polycrystalline SiC 12 is grown by chemical vapor deposition in the SiC growth step. In the SiC growth step, a form may be employed in which impurities that generate carriers are introduced to achieve uniform diffusion of, for example, nitrogen or phosphorus within the polycrystalline SiC 12.

Illustrated in the above-described embodiment is the method for manufacturing the bonded substrate 1 formed of the support substrate 2 and the semiconductor layer 3 bonded together. In manufacturing the bonded substrate 1, it is preferred that the degree of surface roughness represented by an arithmetic average roughness be 1 nm or less on at least one of the front side or the back side of the support substrate 2. In addition, it is preferred that, on at least one of the front side or the back side of the polycrystalline SiC 12, all recesses formed on the front side and the back side be each such that the distance between the front side or the back side and a point in the recess farthest from the front side or the back side, respectively, is 3 nm or less. The thus-configured support substrate 2, owing to the surface thereof being less uneven, makes it possible, in manufacturing the bonded substrate 1 in which the semiconductor layer 3 formed of the single crystal SiC is bonded onto the support substrate 2, to increase the bonding strength in the bonded surface between the semiconductor layer 3 and the support substrate 2. Consequently, yields of the bonded substrate 1 can be improved.

Illustrated in the above-described embodiment is the form in which the polycrystalline SiC is grown by chemical vapor deposition in the base material preparation step of S10 and in the SiC growth step of S20. However, the polycrystalline SiC may be grown using a sublimation method in which a SiC raw material is sublimated and then crystallized.

The invention claimed is:

1. A polycrystalline SiC substrate comprising polycrystalline SiC therethrough and having a first side and a second side,
    wherein a substrate grain size change rate, which is a value obtained by dividing a difference between an average value of crystal grain sizes of the polycrystalline SiC on the first side and an average value of crystal grain sizes of the polycrystalline SiC on the second side by a thickness of the polycrystalline SiC substrate, is 0.43% or less, and
    wherein a radius of curvature of the polycrystalline SiC substrate is 142 m or more.

2. The polycrystalline SiC substrate according to claim 1, wherein, on at least one of the first side or the second side, a degree of surface roughness represented by an arithmetic average roughness is 1 nm or less.

3. The polycrystalline SiC substrate according to claim 1, wherein, on a surface of at least one of the first side or the second side, all recesses formed on the surface are each such that a distance between the surface and a point in the recess farthest from the surface is 3 nm or less.

4. The polycrystalline SiC substrate according to claim 1, wherein the polycrystalline SiC is grown by chemical vapor deposition.

5. The polycrystalline SiC substrate according to claim 1, wherein the polycrystalline SiC is grown by a sublimation method.

6. A method for manufacturing a polycrystalline SiC substrate according to claim 1, the method comprising:
    a base material preparation step comprising growing polycrystalline SiC on a first base material under a first growth condition set in advance and then cutting out the polycrystalline SiC grown on the first base material, to thereby prepare a second base material formed of the polycrystalline SiC;
    a growth step comprising growing polycrystalline SiC on the second base material under a second growth condition set in advance; and
    a separation step comprising separating at least a part of the polycrystalline SiC grown on the second base material from the second base material, wherein a separated polycrystalline SiC is used as the polycrystalline SiC substrate, the polycrystalline SiC substrate comprising polycrystalline SiC therethrough and having a first side and a second side,
    wherein a substrate grain size change rate, which is a value obtained by dividing a difference between an average value of crystal grain sizes of the polycrystalline SiC on the first side and an average value of crystal grain sizes of the polycrystalline SiC on the second side by a thickness of the polycrystalline SiC substrate, is 0.43% or less, and
    wherein a radius of curvature of the polycrystalline SiC substrate is 142 m or more.

* * * * *